(12) United States Patent
Jeong

(10) Patent No.: US 8,399,890 B2
(45) Date of Patent: Mar. 19, 2013

(54) SEMICONDUCTOR LIGHT EMITTING DEVICE AND LIGHT EMITTING APPARATUS HAVING THEREOF

(75) Inventor: Hwan Hee Jeong, Ulsan (KR)

(73) Assignee: LG Innotek Co., Ltd., Seoul (KR)

( * ) Notice: Subject to any disclaimer, the term of this patent is extended or adjusted under 35 U.S.C. 154(b) by 386 days.

(21) Appl. No.: 12/580,771

(22) Filed: Oct. 16, 2009

(65) Prior Publication Data
US 2010/0096646 A1    Apr. 22, 2010

(30) Foreign Application Priority Data
Oct. 17, 2008    (KR) ........................ 10-2008-0102236

(51) Int. Cl.
*H01L 29/18*    (2006.01)
(52) U.S. Cl. ............... 257/88; 257/93; 257/E27.119; 438/28
(58) Field of Classification Search .............. 257/88, 257/93, E27.119; 438/28
See application file for complete search history.

(56) References Cited

U.S. PATENT DOCUMENTS

| | | | |
|---|---|---|---|
| 2004/0061433 A1* | 4/2004 | Izuno et al. ................ | 313/498 |
| 2006/0154390 A1 | 7/2006 | Tran et al. | |
| 2006/0163589 A1* | 7/2006 | Fan et al. .................... | 257/88 |
| 2006/0169993 A1 | 8/2006 | Fan et al. | |
| 2007/0257268 A1 | 11/2007 | Shakuda et al. | |
| 2008/0017871 A1* | 1/2008 | Lee et al. ................... | 257/88 |
| 2008/0083929 A1* | 4/2008 | Fan et al. ................... | 257/79 |
| 2008/0230765 A1 | 9/2008 | Yoon et al. | |
| 2009/0039359 A1* | 2/2009 | Yoon et al. ................. | 257/88 |
| 2009/0267085 A1 | 10/2009 | Lee et al. | |

FOREIGN PATENT DOCUMENTS

| | | |
|---|---|---|
| EP | 1 973 161 A2 | 9/2008 |
| JP | 2006-080441 A | 3/2006 |
| JP | 2006-135367 A | 5/2006 |
| JP | 2008-533716 A | 8/2008 |
| KR | 10-2006-0065954 A | 6/2006 |
| KR | 10-2006-0121454 A | 11/2006 |
| KR | 10-2007-0115870 A | 12/2007 |
| KR | 10-2008-0085343 A | 9/2008 |
| WO | 2007/001124 A1 | 1/2007 |
| WO | 2007/081092 A1 | 7/2007 |

* cited by examiner

*Primary Examiner* — Thao Le
*Assistant Examiner* — Matthew Gordon
(74) *Attorney, Agent, or Firm* — Birch, Stewart, Kolasch & Birch, LLP

(57) ABSTRACT

Embodiments relate to a semiconductor light emitting device and a light emitting apparatus comprising the same. The semiconductor light emitting device according to embodiments comprises a plurality of light emitting cells comprising a plurality of compound semiconductor layers; a plurality of ohmic contact layers on the light emitting cells; a first insulating layer on the ohmic contact layer; a second electrode layer electrically connected to a first light emitting cell of the light emitting cells; and a plurality of interconnection layers connecting the light emitting cells in series.

19 Claims, 7 Drawing Sheets

SEMICONDUCTOR LIGHT EMITTING DEVICE AND LIGHT EMITTING APPARATUS HAVING THEREOF

CROSS-REFERENCE TO RELATED APPLICATIONS

The present application claims priority under 35 U.S.C. 119 and 35 U.S.C. 365 to Korean Patent Application No. 10-2008-0102236 (filed on Oct. 17, 2008), which is hereby incorporated by reference in its entirety.

BACKGROUND

The present disclosure relates to a semiconductor light emitting device and a light emitting apparatus having thereof.

Group III-V nitride semiconductors have been widely used as the core materials of light emitting devices such as Light Emitting Diodes (LED) and Laser Diodes (LD), in physical and chemical characteristics. The group III-V nitride semiconductors consist of semiconductor materials having the composition equation of $In_xAl_yGa_{1-x-y}N$ (where $0 \leq x \leq 1$, $0 \leq y \leq 1$, and $0 \leq x+y \leq 1$).

The LED is a sort of semiconductor device that changes electricity into infrared rays or light by using the characteristics of compound semiconductor to input/output a signal, or is used as a light source.

The LED or the LD with nitride semiconductor materials is much applied to the light emitting devices for obtaining light. For example, the LED or the LD is applied as the light sources of all sorts of products such as the light emitting portions of the key pads of cellular phones, electronic display boards and lighting devices.

SUMMARY

Embodiments provide a semiconductor light emitting device comprising a plurality of light emitting cells for an Alternating Current (AC) power.

Embodiments provide a semiconductor light emitting device comprising a plurality of light emitting cells between a plurality of electrodes.

Embodiments also provide a semiconductor light emitting device in which a plurality of light emitting cell arrays are connected in series and/or in parallel and in partial series and/or in partial parallel.

Embodiments provide a light emitting apparatus in which semiconductor light emitting devices, having a plurality of light emitting cells, are connected to each other in series, in parallel or in anti-parallel.

Embodiments provide a light emitting apparatus on which at least one semiconductor light emitting device comprising a plurality of light emitting cells is mounted.

An embodiment provides an semiconductor light emitting device, comprising: a plurality of light emitting cells comprising a plurality of compound semiconductor layers; a plurality of ohmic contact layers on the light emitting cells; a first insulating layer on the ohmic contact layer; a second electrode layer electrically connected to a first light emitting cell of the light emitting cells; and a plurality of interconnection layers connecting the light emitting cells in series.

An embodiment provides an semiconductor light emitting device, comprising: a plurality of light emitting cell arrays comprising a plurality of compound semiconductor layers; a plurality of ohmic contact layers on the light emitting cell arrays; a first insulating layer on the ohmic contact layer; a plurality of second electrode layers electrically connected to a first light emitting cell of a one end of the each light emitting cell array; a plurality of interconnection layers connecting the light emitting cell arrays in series; and a connection node electrically connecting both ends of the light emitting cell arrays.

An embodiment provides an semiconductor light emitting device, comprising: a plurality of semiconductor light emitting devices comprises a plurality of light emitting cell arrays comprising a plurality of compound semiconductor layers, a plurality of ohmic contact layers on the light emitting cell arrays, a first insulating layer on the ohmic contact layer, a second electrode layer on a first ohmic contact layer of the ohmic contact layers, a first electrode electrically connected to a nth light emitting cell of the light emitting cells, and a plurality of interconnection layers connecting the light emitting cells in series; and a connection node electrically connecting the semiconductor light emitting devices.

The details of one or more embodiments are set forth in the accompanying drawings and the description below. Other features will be apparent from the description and drawings, and from the claims.

DETAILED DESCRIPTION OF THE EMBODIMENTS

Figure 1:
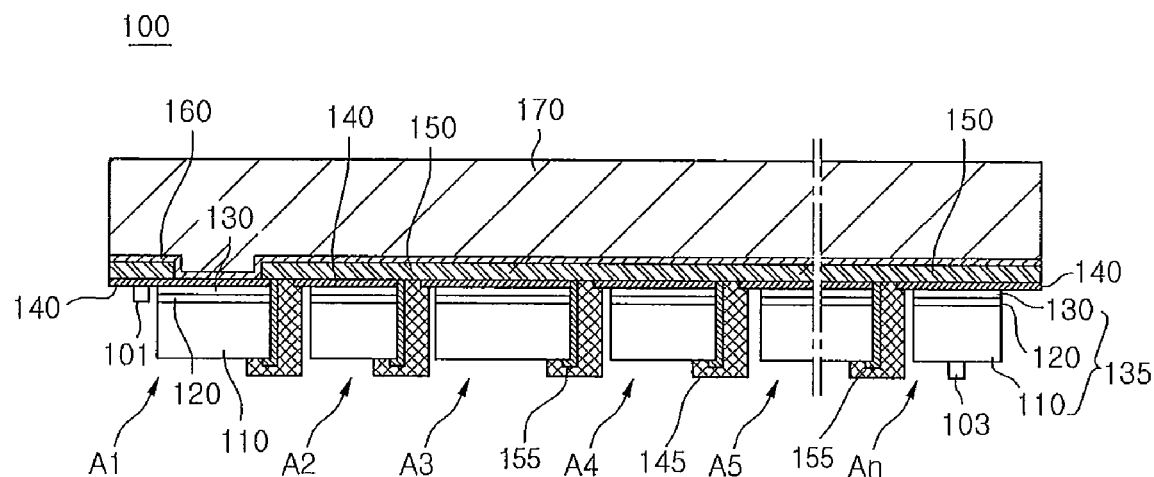
FIG. 1 is a side-sectional view illustrating a semiconductor light emitting device according to a first embodiment.

Reference will now be made in detail to the embodiments of the present disclosure, examples of which are illustrated in the accompanying drawings. In description of embodiments, the 'on' or 'under' of each layer may be described with reference to the accompanying drawings, and the thickness of the each layer will also be described as an example and is not limited to the thickness of the accompanying drawings.

In the description of embodiments, it will be understood that when a layer (or film), region, pattern or structure is referred to as being 'on' or 'under' another layer (or film), region, pad or pattern, the terminology of 'on' and 'under' comprises both the meanings of 'directly' and 'indirectly'. Further, the reference about 'on' and 'under' each layer will be made on the basis of drawings. Also, the thickness of each layer in the drawings is an example, and is not limited thereto.

FIG. 1 is a side-sectional view illustrating a semiconductor light emitting device according to a first embodiment.

Referring to FIG. 1, a semiconductor light emitting device 100 according to a first embodiment comprises a plurality of light emitting cells A1 to An, a plurality of ohmic contact layers 140, a plurality of interconnection layers 145, a first insulating layer 150, a second insulating layer 155, a second electrode layer 160, and a conductive support member 170.

The semiconductor light emitting device 100 may comprise an n (where, n≧2) number of light emitting cells A1 to An that are arrayed under the conductive support member 170. The respective light emitting cells A1 to An may be manufactured in the same size or in different sizes, but this is not limited thereto. The light emitting cells A1 to An may be spaced at regular distances or irregular distances apart.

The light emitting cells A1 to An may be arrayed in at least one row or in a matrix type. The light emitting cells A1 to An may be defined as a light emitting cell array group. In addition, the light emitting cells A1 to An may be divided into a plurality of light emitting cell array groups. Herein, the light emitting cell array group may be defined as cells that are driven during a driving mode or the half cycle of an Alternating Current (AC) power.

Each of the light emitting cells A1 to An may be defined as a light emitting structure 135 that comprises a plurality of compound semiconductor layers 110, 120 and 130. The light emitting structure 135 comprises a first conductive semiconductor layer 110, an active layer 120, and a second conductive semiconductor layer 130.

The first conductive semiconductor layer 110 may be selected from the compound semiconductor of group III-V elements and is doped a first conductive dopant. The first conductive semiconductor layer 110 may be selected from the compound semiconductor, for example, GaN, AlN, AlGaN, InGaN, InN, InAlGaN, AlInN, AlGaAs, GaP, GaAs, GaAsP and AlGaInP. In a case where the first conductive semiconductor 110 is an N-type semiconductor layer, the first conductive dopant comprises an N-type dopant such as Si, Ge, Sn, Se and Te. The first conductive semiconductor layer 110 may be formed in a single layer or a multi layer, but it is not limited thereto. A roughness pattern (not shown) may be formed at the bottom of the first conductive semiconductor layer 110 for light extraction efficiency.

The active layer 120 is formed on the first conductive semiconductor layer 110, and the active layer 120 may be formed in a single quantum well structure or a multiple quantum well structure. The active layer 120 may be formed at the period of a well layer and a barrier layer, for example, the period of an InGaN well layer/GaN barrier layer or the period of an AlGaN well layer/GaN barrier layer by using the compound semiconductor material of group III-V elements.

A conductive clad layer may be formed on and/or under the active layer 120, and the conductive clad layer may be formed of an AlGaN-based semiconductor.

The second conductive semiconductor layer 130 is formed on the active layer 120, and the second conductive semiconductor layer 130 may be selected from the compound semiconductor of group III-V elements (on which a second conductive dopant is doped), for example, GaN, AlN, AlGaN, InGaN, InN, InAlGaN, AlInN, AlGaAs, GaP, GaAs, GaAsP and AlGaInP. In a case where the second conductive semiconductor layer 130 is a P-type semiconductor layer, the second conductive dopant may comprise a P-type dopant such as Mg and Zn. The second conductive semiconductor layer 130 may be formed in a single layer or a multi layer, but it is not limited thereto.

The light emitting structure 135 may comprise an N-type semiconductor layer or a P-type semiconductor layer on the second conductive semiconductor layer 130. In addition, the first conductive semiconductor layer 110 may be formed as a P-type semiconductor layer, and the second conductive semiconductor layer 130 may be formed as an N-type semiconductor layer. Accordingly, the light emitting structure 135 may comprise at least one of an N-P junction structure, a P-N junction structure, an N-P-N junction structure and a P-N-P junction structure.

The respective ohmic contact layers 140 are formed on the light emitting cells A1 to A6. The ohmic contact layers 140 are formed on the second conductive semiconductor layer 130 of the light emitting structure 135 or a third conductive semiconductor layer.

The ohmic contact layer 140 may comprise at least one of ohmic-characteristic materials, for example, indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO) and antimony tin oxide (ATO), gallium zinc oxide (GZO), IrOx, RuOx, RuOx/ITO, Ni/IrOx/Au, Ni/IrOx/Au/ITO, Pt, Ni, Au, Rh and Pd. The ohmic contact layer 140 may be formed in a layer or a plurality of patterns.

The first insulating layer 150 is formed on the ohmic contact layers 140. The first insulating layer 150 may be formed of at least one of dielectric materials or insulating materials, for example, $SiO_2$, $Si_3N_4$, $Al_2O_3$ and $TiO_2$. The first insulating layer 150 may be formed of a light-transmitting insulating material or a thermal conductive insulating material.

The second electrode layer 160 is formed on the first insulating layer 150, and the conductive support member 170 may be formed on the second electrode layer 160.

The one end of the second electrode layer 160 is directly contacted on the ohmic contact layer 140 of the first light emitting cell A1, thereby supplying a second polarity power to the first light emitting cell A1. The second electrode layer 160 may be electrically connected to the one-end ohmic contact layer of the ohmic contact layers 140. A contact type between the second electrode layer 160 and the ohmic contact layers 140 may be modified in the spirits and scopes of embodiments.

The second electrode layer 160 may serve as a reflection electrode layer. For example, the second electrode layer 160 may be formed at least one of layers and formed of at least one of Ag, Ni, Al, Rh, Pd, Ir, Ru, Mg, Zn, Pt, Au and Hf, and materials consisting of the selective combination of these elements.

The conductive support member 170 serves as the base substrate of the semiconductor light emitting device 100, and may be formed of at least one of Cu, Au, Ni, Mo, Cu—W and a carrier wafer such as Si, Ge, GaAs, ZnO, SiGe, GaN, and SiC. The conductive support member 170 may be formed in an electro plating process, wafer or a sheet form, but it is not limited thereto.

A plurality of second insulating layers 155 are formed at the one side of the n–1 light emitting cells A1 to A(n–1) except for the light emitting cell An (i.e., an nth cell) of the light emitting cells A1 to An. The second insulating layer 155 is formed at the outside of the first conductive semiconductor layer 110, active layer 120 and second conductive semiconductor layer 130 of the light emitting structure 135, thereby preventing interlayer short due to the interconnection layer 145. The second insulating layer 155 is formed between the ohmic contact layers 145 formed on the light emitting cells A1 to An that are adjacent to each other, thereby preventing electrical short.

The interconnection layers 145 are formed on the second insulating layer 155 and thereby electrically connects the two adjacent light emitting cells of the light emitting cells A1 to An, i.e., the adjacent light emitting cells A1 and A2, A2 and A3, . . . , A(n−1) and An.

An one end of the interconnection layer 145 electrically connects the first conductive semiconductor layer 110 of the first light emitting cell A1 and an other end of interconnection layer 145 electrically connects the ohmic contact layer 140 formed on the first light emitting cell A2. When the first conductive semiconductor layer 110 is a GaN-based semiconductor, the one end of the interconnection layer 145 may be directly contacted with an N-face which is the bottom of the first conductive semiconductor layer 110.

The one end of the interconnection layer 145 is connected to the first conductive semiconductor layer 110 of the one-side light emitting cell, and the other end of the interconnection layer 145 is electrically connected to the ohmic contact layer 140 of the other-side light emitting cell adjacent the one-side light emitting cell. Herein, in the two adjacent light emitting cells, the one-side light emitting cell may be defined as a cell for supplying a power and the other-side light emitting cell may be defined as a cell for receiving the power.

The interconnection layer 145 may electrically connect the first conductive semiconductor layer 110 of the one-side light emitting cell and the first conductive semiconductor layer 110 of the other-side light emitting cell that are adjacent to each other. Accordingly, the interconnection layers 145 connects the two adjacent light emitting cells of the light emitting cells A1 to An, i.e., the adjacent light emitting cells A1 and A2, A2 and A3, . . . , A(n−1) and An.

For example, since the first interconnection layer 145 is directly connected to the first conductive semiconductor layer 110 of the first light emitting cell A1 and the ohmic contact layer 140 of the second light emitting cell A2, it may connect the first and second light emitting cells A1 and A2 in series. Through this process, the plurality of interconnection layers 145 (i.e., the n−1 interconnection layers 145) may connect the light emitting cells A1 and An in series.

The first electrode 103 is formed under the first conductive semiconductor layer 110 of the nth light emitting cell An, and the second electrode 101 is formed under the first ohmic contact layer 140 formed on the second conductive semiconductor layer 130 of the first light emitting cell A1. The first light emitting cell A1 may be receive the second polarity power through the conductive support member 170 or/and the second electrode 101. The second electrode 101 may not be formed.

In the semiconductor light emitting device 100, the light emitting cells A1 and An are connected on the interconnection layer 145 in series and may receive a power through the first and second electrodes 103 and 101 or the conductive support member 170.

The light emitting cells A1 and An of the semiconductor light emitting device 100 may drive at the half cycle of a sine-wave AC power, and thus can emit light for the half cycle of the AC power.

The semiconductor light emitting device 100 may be mounted on a main substrate or a package body, but it is not limited thereto.

According to embodiments, a semiconductor light emitting device may be designed to be alternately driven per the half cycle of the sine-wave AC power by use of a plurality of semiconductor light emitting devices.

Figure 2:
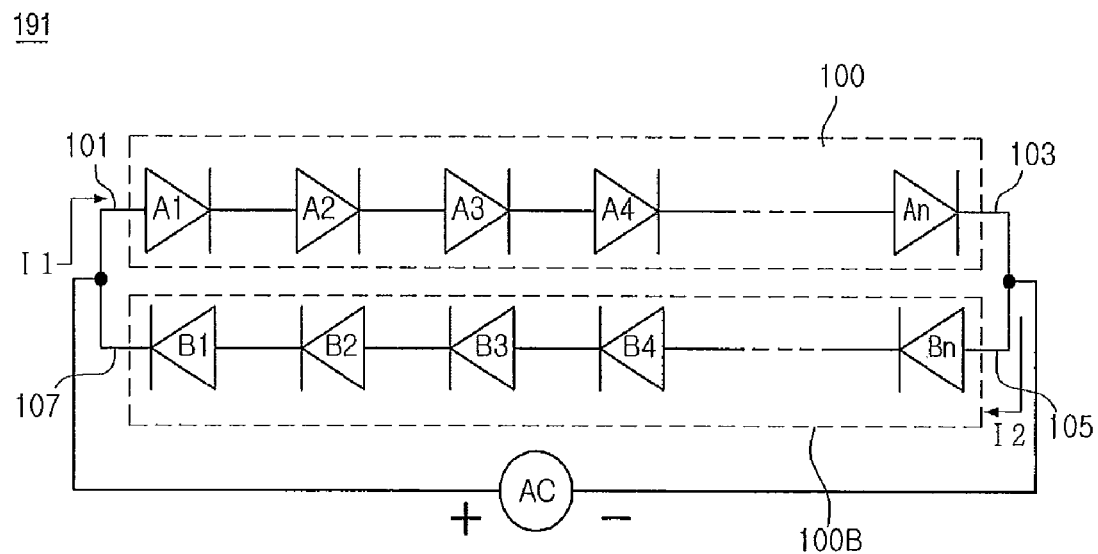
FIG. 2 is a block diagram illustrating a light emitting apparatus according to a second embodiment.

According to embodiments, in addition, the semiconductor light emitting device may be manufactured by arranging the plurality of semiconductor light emitting devices in two rows on one support substrate. For example, the plurality of semiconductor light emitting devices may comprise a 2n number of light emitting cells, i.e., a plurality of light emitting cell arrays. In addition, by disposing a plurality of second electrodes, a plurality of first insulating layers and a plurality of light emitting cell arrays under a conductive support member, the plurality of light emitting cell arrays may be formed as illustrated in FIG. 2. The plurality of light emitting cell arrays may be formed by a connection node in series, in parallel or in anti-parallel. Herein, the plurality of light emitting cell arrays, for example, may be connected in anti-parallel as illustrated in FIG. 2.

Herein, about sixty light emitting cells for 3.5V driving may be connected in series at a 220V AC power. In addition, about thirty light emitting cells for 3.5V driving may be connected in series at a 110V AC power. Accordingly, the number of light emitting cells of the semiconductor light emitting device 100 may be varied with an sine-wave AC power that is inputted. This may be modified in the spirits and scopes of embodiments.

Herein, the driving voltage of each of the light emitting cells A1 to An may be varied, and if the driving voltage is varied, the number of light emitting cells may be varied. In addition, the input terminal of the semiconductor light emitting device 100 may receive a power that passes through a separate electronic device, but it is not limited thereto.

FIG. 2 is a block diagram illustrating a light emitting apparatus according to a second embodiment. In description of the second embodiment, repetitive description on the same elements as or similar to those of the first embodiment will be omitted and refers to the first embodiment.

Referring to FIG. 2, a light emitting apparatus 191 comprises a plurality of semiconductor light emitting devices 100 and 100B. The light emitting apparatus 191 may be a semiconductor light emitting device that comprises a group consisting of a plurality of light emitting cell arrays A1 to An and B1 to Bn, or may comprise a plurality of semiconductor light emitting devices. Hereinafter, for convenience, it is assumed that the light emitting apparatus 191 has a structure in which the both ends of the first semiconductor light emitting device 100 are respectively connected to the both ends of the second semiconductor light emitting device 100B. The each layer feature and chip structures of the first and second semiconductor light emitting devices 100 and 100B refer to the first embodiment.

In the first semiconductor light emitting device 100, the light emitting cells A1 to An are connected in series. In the second semiconductor light emitting device 100B, the light emitting cells B1 to Bn are connected in series. The first and second semiconductor light emitting devices 100 and 100B are connected in anti-parallel.

The second electrode 101 of the first semiconductor light emitting device 100 or the conductive support member 170 and the first electrode 107 of the second semiconductor light emitting device 100B may be electrically connected to the second polarity terminal of an AC power. The first electrode 103 of the first semiconductor light emitting device 100 and the second electrode 105 of the second semiconductor light emitting device 100B or the conductive support member 170 are electrically connected to the first polarity terminal of the AC power.

When the AC power is supplied, the second polarity of the AC power is supplied to the second electrode 101 of the first semiconductor light emitting device 100 for the half cycle of a sine-wave cycle and flows through the first semiconductor light emitting device 100, thereby emitting the light emitting cells A1 to An. In addition, the second polarity is supplied to the second electrode 105 of the first semiconductor light emitting device 100B for the other half cycle of the sine-wave cycle and flows through the second semiconductor light emitting device 100B, thereby emitting the light emitting cells B1 to Bn.

In the light emitting apparatus 191, the first and second semiconductor light emitting devices 100 and 100B are alternately driven by the AC power. At this point, by controlling the frequency of the power, the on/off cycle of a light emitting diode (LED) may be varied.

The first and second semiconductor light emitting devices 100 and 100B may be connected as one circuit group, and may be connected to each other in anti-parallel to configure a light emitting apparatus. In addition, a light emitting apparatus according to an embodiment may be manufactured with the plurality of first semiconductor light emitting devices 100 or/and the plurality of second semiconductor light emitting devices 100B.

In the light emitting apparatus 191, alternatively, the color, chromaticity, wavelength and brightness of the plurality of first and second semiconductor light emitting devices 100 and 100B may be the same as, similar to or different from each other.

The first semiconductor light emitting device 100 may emit ultraviolet (UV) light or chromatic light such as blue, red and green. The second semiconductor light emitting device 100B may emit UV light or chromatic light such as blue, red and green.

In addition, the first and second semiconductor light emitting devices 100 and 100B may be formed in the same rank or different ranks. When the first and second semiconductor light emitting devices 100 and 100B uses different ranks, chip yield can be improved. The ranks may be set based on wavelength, chromaticity and brightness. For example, if the peak wavelength of the first semiconductor light emitting device 100 differs from the peak wavelength of the second semiconductor light emitting device 100B, the peak wavelength of a target rank may be realized with light where the first and second semiconductor light emitting devices 100 and 100B are mixed. Alternatively, when the first and second semiconductor light emitting devices 100 and 100B have a co-dependent relationship or a complementary color relationship on the basis of a target chromaticity rank, target chromaticity may be controlled by mixture of the first and second semiconductor light emitting devices 100 and 100B.

Figure 3:
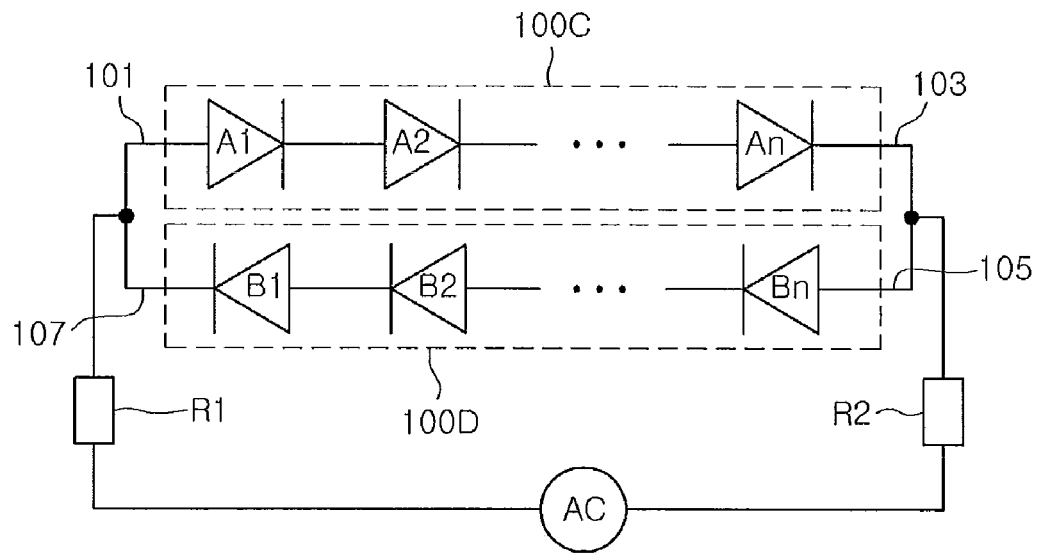
FIG. 3 is a block diagram illustrating a light emitting apparatus according to a third embodiment.

FIG. 3 is a block diagram illustrating a light emitting apparatus according to a third embodiment. In description of the third embodiment, repetitive description on the same elements as or similar to those of the first embodiment and/or the second embodiment will be omitted and refers to the first embodiment and/or the second embodiment.

Referring to FIG. 3, a light emitting apparatus 192 has a structure in which third and fourth light emitting devices 100C and 100D are connected in anti-parallel. In the third light emitting devices 100C, an n number of light emitting cells A1 to An are connected in series. In the fourth semiconductor light emitting device 100D, an n number of light emitting cells B1 to Bn are connected in series.

The second electrode 101 of the third semiconductor light emitting device 100C or the conductive support member 170 and the first electrode 103 of the fourth semiconductor light emitting device 100D may be electrically connected to the second polarity terminal of an AC power. The first electrode 103 of the third semiconductor light emitting device 100C and the second electrode 105 of the fourth semiconductor light emitting device 100D or/and the conductive support member 170 are electrically connected to the first polarity terminal of the AC power.

In addition, resistors R1 and R2 may be connected to the input terminal of the light emitting apparatus 192. By connecting the resistors R1 and R2, the number of light emitting cells A1 to An of the third semiconductor light emitting device 100C and the number of light emitting cells B1 to Bn of the fourth semiconductor light emitting device 100D may be reduced. Herein, current limiting devices such as the resistors R1 and R2, a capacitor and an inductor may be comprised in the input terminal of the light emitting apparatus 192.

The third and fourth light emitting devices 100C and 100D are a light emitting apparatus having a structure in which they are connected in anti-parallel, and they may be used as a lighting device using an AC power.

Figure 4:
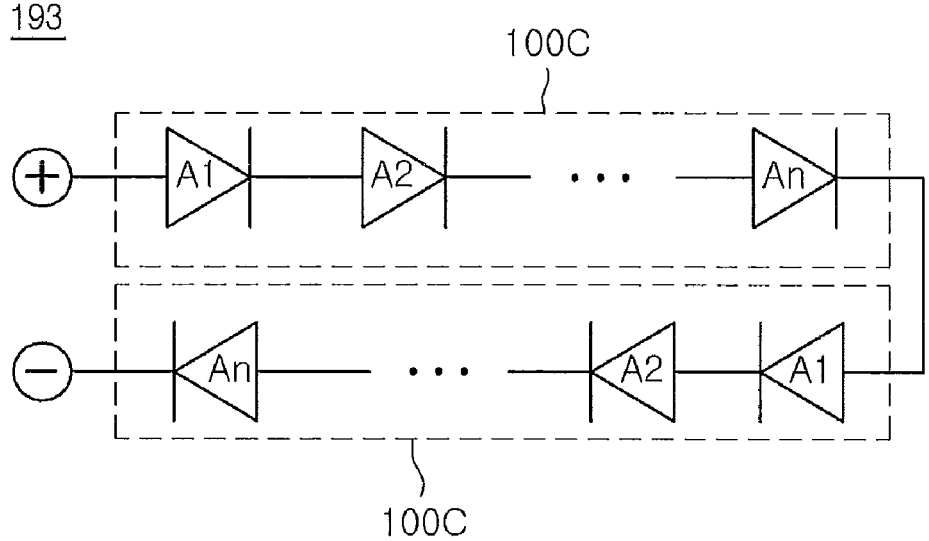
FIG. 4 is a block diagram illustrating a light emitting apparatus according to a fourth embodiment.

FIG. 4 is a block diagram illustrating a light emitting apparatus according to a fourth embodiment. In description of the fourth embodiment, repetitive description on the same elements as or similar to those of the embodiments will be omitted and refers to the description of the embodiments. A detailed description on the layer characteristic and structure of the semiconductor light emitting device refers to the first embodiment.

Referring to FIG. 4, a light emitting apparatus 193 may have a structure in which a plurality of third semiconductor light emitting devices 100C are connected in series or a plurality of light cell array groups are connected in series. At this point, by increasing a power frequency to twice higher than a general frequency, the light emitting apparatus 193 can serve as a lighting device.

Figure 5:
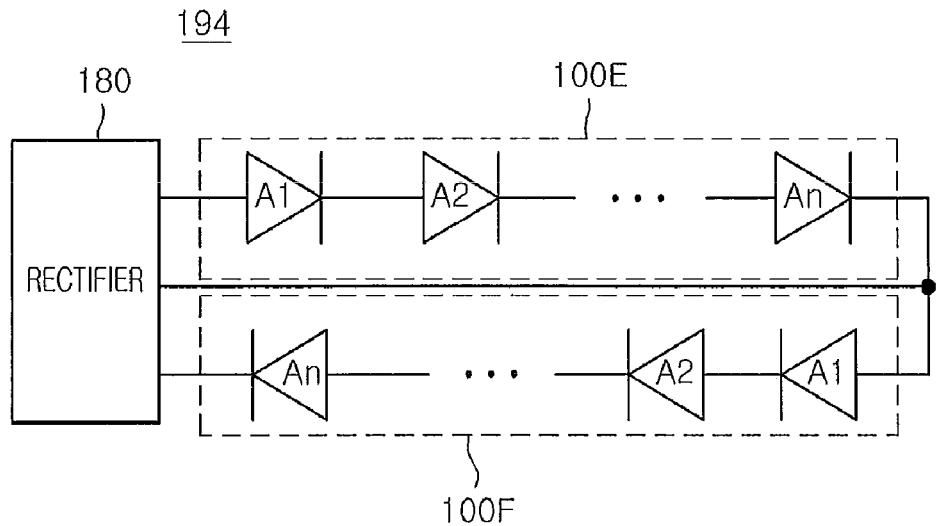
FIG. 5 is a block diagram illustrating a light emitting apparatus according to a fifth embodiment.

FIG. 5 is a block diagram illustrating a light emitting apparatus according to a fifth embodiment.

Referring to FIG. 5, a light emitting apparatus 194 comprises a plurality of fifth and sixth semiconductor light emitting devices 100E and 100F, and a rectifier 180. The rectifier 180 may be manufactured with a bridge diode. The rectifier 180 may alternately drive the fifth and sixth semiconductor light emitting devices 100E and 100F.

In the light emitting apparatus 194, an AC power alternately flows in the plurality of fifth and sixth semiconductor light emitting devices 100E and 100F, which are connected in anti-parallel, through the rectifier 180 per half cycle. The fifth semiconductor light emitting device 100E is driven from the first light emitting cell A1 by a second polarity power. The sixth semiconductor light emitting device 100F is driven from the first light emitting cell A1 by a first polarity power.

Figure 6:
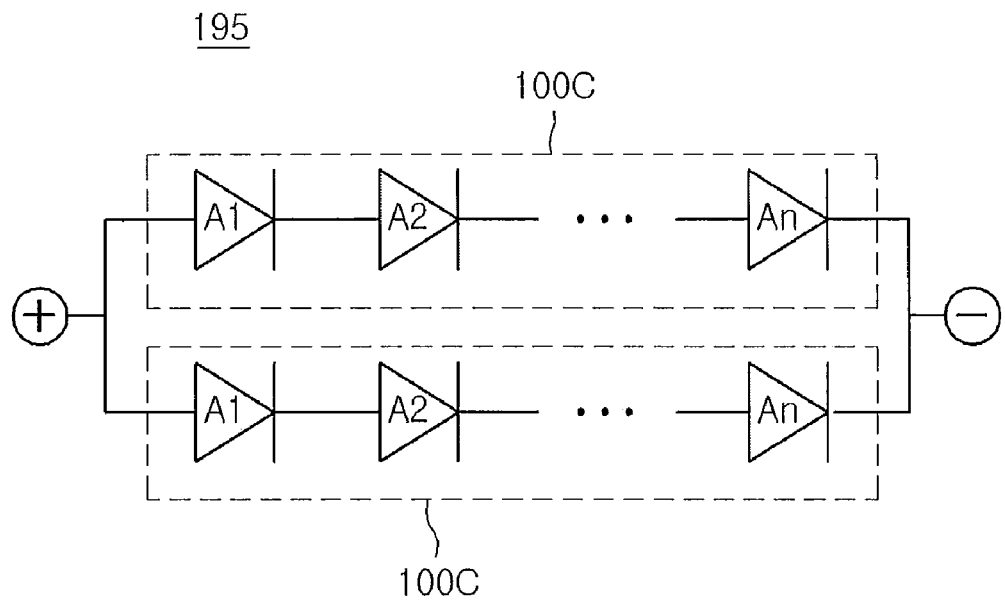
FIG. 6 is a block diagram illustrating a light emitting apparatus according to a sixth embodiment.

FIG. 6 is a block diagram illustrating a light emitting apparatus according to a sixth embodiment. In description of the sixth embodiment, repetitive description on the same elements as or similar to those of the embodiments will be omitted and refers to the embodiments.

Referring to FIG. 6, in a light emitting apparatus 195, a plurality of semiconductor light emitting devices 100C may be connected in parallel. The semiconductor light emitting device 100C has a structure in which a 2n number of light emitting cells A1 to An are connected in series. In the semiconductor light emitting device 100C, the 2n light emitting cells A1 to An may be disposed under the conductive support member 170, or two semiconductor light emitting devices may be connected in series.

FIGS. 7 to 13 are diagrams illustrating a method for manufacturing the semiconductor light emitting device in FIG. 1.

Figure 7:
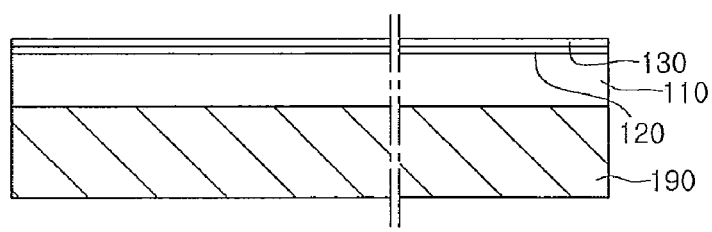
FIGS. 7 to 13 are diagrams illustrating a method for manufacturing the semiconductor light emitting device in FIG. 1.

Referring to FIG. 7, a substrate 190 is loaded at growth equipment, and the compound semiconductor layer of group II to VI elements may grow on it.

The compound semiconductor layer of group II to VI elements may grow by growth equipment such as electron beam evaporator, Physical Vapor Deposition (PVD), Chemical Vapor Deposition (CVD), Plasma Laser Deposition (PLD), dual-type thermal evaporator, sputtering and Metal Organic Chemical Vapor Deposition (MOCVD), but it is not limited thereto.

The substrate 190 may be selected from the group consisting of sapphire substrate ($Al_2O_3$), GaN, SiC, ZnO, Si, GaP, InP, $Ga_2O_3$, a dielectric substrate, a conductive substrate and GaAs. A concave-convex pattern or a light extraction structure may be formed at the upper portion of the substrate 190.

At least one of semiconductor layers using the compound semiconductor layer of group II to VI elements, for example, a ZnO layer (not shown), a buffer layer (not shown) and an undoped semiconductor layer (not shown), may be formed on the substrate 190. The compound semiconductor layer of group II to VI elements may be formed as a layer or a plurality of patterns. The buffer layer and the undoped semiconductor layer may be formed with the compound semiconductor layer of group II to VI elements. The buffer layer decreases a lattice constant difference with the substrate 190. The undoped semiconductor layer may be formed of an undoped GaN-based semiconductor.

A light emitting structure comprising a plurality of compound semiconductor layers is formed on the substrate 190. The light emitting structure comprises a first conductive semiconductor layer 110, an active layer 120, and a second conductive semiconductor layer 130.

The first conductive semiconductor layer 110 may be selected from the compound semiconductor of group III-V elements (on which a first conductive dopant is doped), for example, GaN, AlN, AlGaN, InGaN, InN, InAlGaN, AlInN, AlGaAs, GaP, GaAs, GaAsP and AlGaInP. In a case where the first conductive semiconductor 110 is an N-type semiconductor layer, the first conductive dopant comprises an N-type dopant such as Si, Ge, Sn, Se and Te. The first conductive semiconductor layer 110 may be formed as a single layer or a multi layer, but it is not limited thereto.

The active layer 120 is formed on the first conductive semiconductor layer 110, and it may be formed in a single quantum well structure or a multiple quantum well structure. The active layer 120 may be formed at the period of a well layer and a barrier layer, for example, the period of an InGaN well layer/GaN barrier layer or the period of an AlGaN well layer/GaN barrier layer by using the compound semiconductor material of group III-V elements.

A conductive clad layer may be formed on and/or under the active layer 120, and the conductive clad layer may be formed of a GaN-based semiconductor.

The second conductive semiconductor layer 130 is formed on the active layer 120, and the second conductive semiconductor layer 130 may be selected from the compound semiconductor of group III-V elements (on which a second conductive dopant is doped), for example, GaN, AlN, AlGaN, InGaN, InN, InAlGaN, AlInN, AlGaAs, GaP, GaAs, GaAsP and AlGaInP. In a case where the second conductive semiconductor layer 130 is a P-type semiconductor layer, the second conductive dopant may comprise a P-type dopant such as Mg and Zn. The second conductive semiconductor layer 130 may be formed as a single layer or a multi layer, but it is not limited thereto.

In addition, the light emitting structure may comprise a third conductive semiconductor layer, for example, an N-type semiconductor layer or a P-type semiconductor layer, on the second conductive semiconductor layer 130. Accordingly, the light emitting structure may comprise at least one of an N—P junction structure, a P—N junction structure, an N—P—N junction structure and a P—N—P junction structure.

Figure 8:
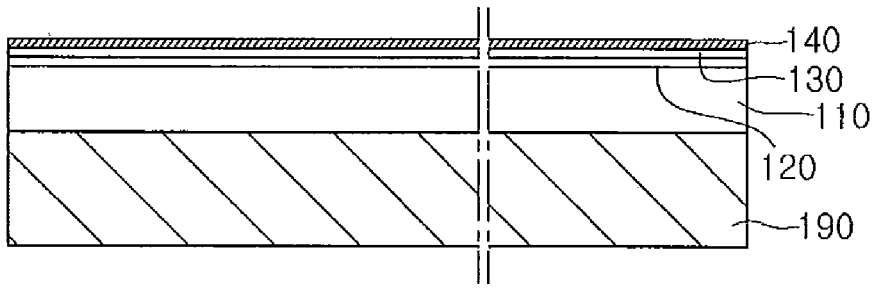

Referring to FIG. 8, the ohmic contact layer 140 is formed on the second conductive semiconductor layer 130 or the third conductive semiconductor layer (not shown). The ohmic contact layer 140 may be formed of at least one of ITO, IZO, IZTO, IAZO, IGZO, IGTO, AZO and ATO, GZO, IrOx, RuOx, RuOx/ITO, Ni/IrOx/Au, Ni/IrOx/Au/ITO, Pt, Ni, Au, Rh, Pd and a metal oxide, or may be selected from a plurality of alloys.

Figure 9:
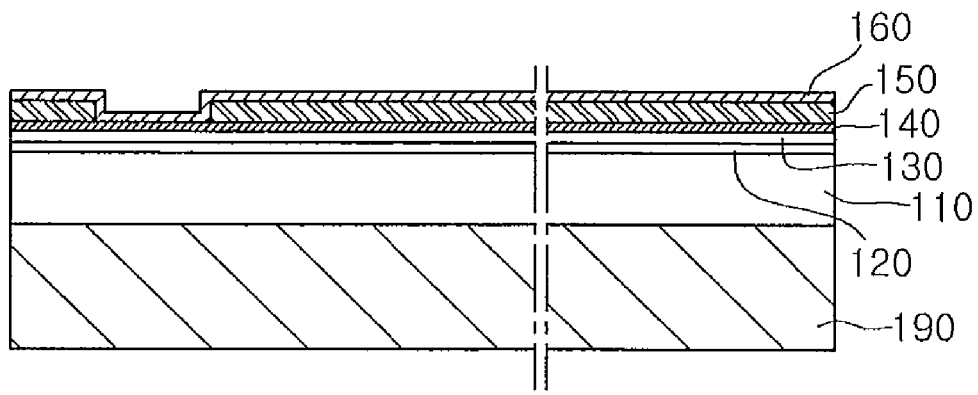

Referring to FIG. 9, a first insulating layer 150 is formed on the ohmic contact layer 140. The first insulating layer 150 may be formed of at least one of dielectric materials or insulating materials, for example, $SiO_2$, $Si_3N_4$, $Al_2O_3$ and $TiO_2$. The first insulating layer 150 may be formed of a light-transmitting insulating material or a thermal conductive insulating material.

The second electrode layer 160 is formed on the ohmic contact layer 140 and the first insulating layer 150, and serves as a reflection electrode layer. The second electrode layer 160 may be formed of at least one of Ag, Ni, Al, Rh, Pd, Ir, Ru, Mg, Zn, Pt, Au and Hf, and materials consisting of the selective combination of these elements.

A portion of the first insulating layer 150 is etched using a mask pattern for electrical contact between the second electrode layer 160 and the ohmic contact layer 140. The second electrode layer 160 and the ohmic contact layer 140 are directly contacted with the etched region.

Figure 10:
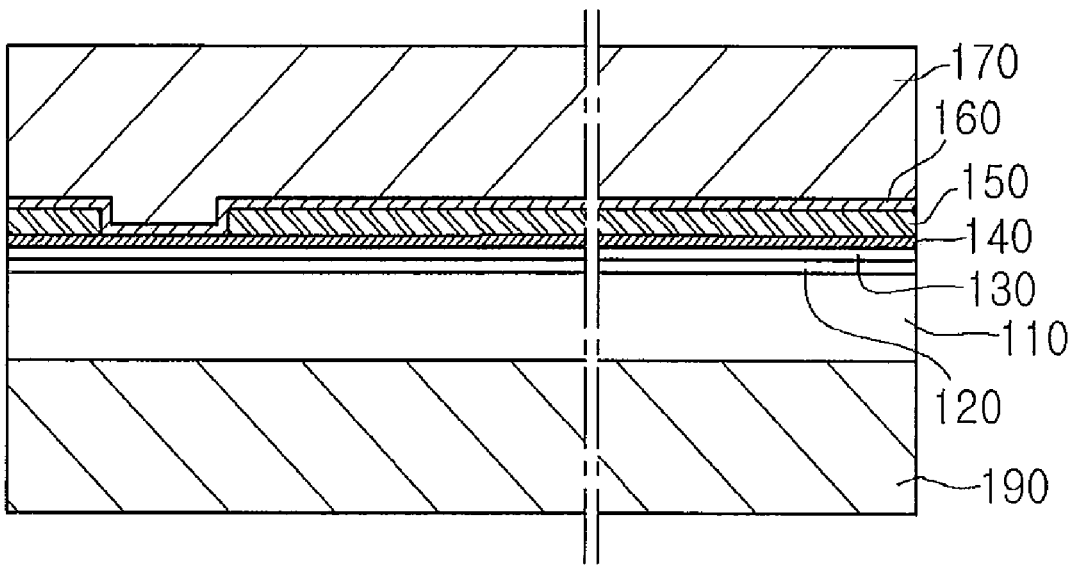

Referring to FIG. 10, a conductive support member 170 is formed on the second electrode layer 160. The conductive support member 170 may be used as the base substrate of a chip. The conductive support member 170 may be formed of at least one of Cu, Au, Ni, Mo, Cu—W and a carrier wafer such as Si, Ge, GaAs, ZnO, SiGe, GaN and SiC, but it is not limited thereto.

The conductive support member 170 may be formed in an electro plating process or a sheet form. Such a formation process may be modified in the spirits and scopes of embodiments.

Figure 11:
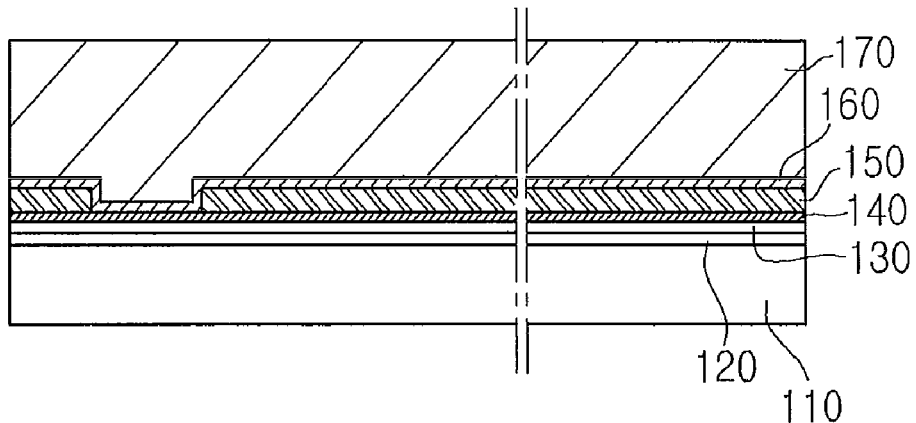

Referring to FIGS. 10 and 11, the conductive support member 170 is disposed at a base, and the substrate 190 is removed. The substrate 190 may be removed through a physical process or/and a chemical process. The physical removing process is a Laser Lift Off (LLO) process, and separates the substrate 190 from a chip though the LLO process that irradiates a certain wavelength onto the substrate 190. When another semiconductor layer (for example, a buffer layer) is formed between the substrate 190 and the first conductive semiconductor layer 110, the chemical removing process may remove the buffer layer with a wet-etching solution, thereby separating the substrate 190 from the chip. A process may be performed which polishes the surface of the first conductive semiconductor layer 110, where the substrate 190 has been removed, through an Inductively Coupled Plasma/Reactive Ion Etching (ICP/RIE) process.

At this point, the ohmic contact layer 140 strengthens an adhesive strength between the second conductive semiconductor layer 130 and the conductive support member 170, protecting the semiconductor light emitting device from an external impact. Accordingly, the electrical reliability of the semiconductor light emitting device can be improved.

Figure 12:
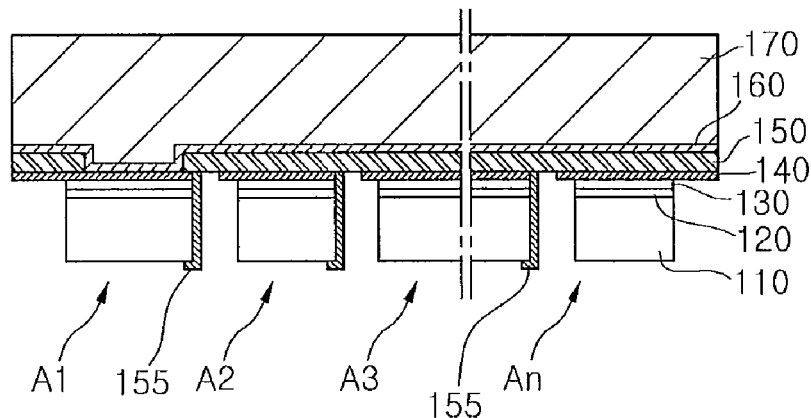
Figure 13:
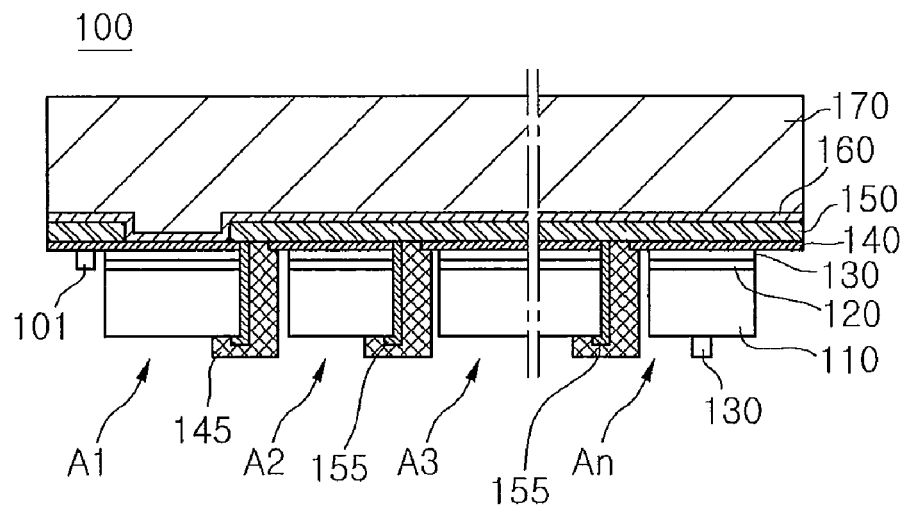

Referring to FIGS. 12 and 13, by etching a cell boundary region, a plurality of light emitting cells A1 to An are divided. The light emitting cells A1 to An may be divided by etching each boundary between the cells, for example, through a wet or/and dry etching process.

The ohmic contact layer 140 is divided by cell unit through an etching process, and the first insulating layer 150 is exposed between the ohmic contact layers 140.

A second insulating layer 155 is formed at each of the one sides of the light emitting cells A1 to A(n−1) other than the light emitting cell An. The second insulating layer 155 is formed at the outer side of the first conductive semiconductor layer 110, the active layer 120, the second conductive semiconductor layer 130 and the ohmic contact layer 140.

An interconnection layer 145 is formed on the second insulating layer 155. The interconnection layer 145 connects in series the two adjacent light emitting cells of the light emitting cells A1 to An, i.e., the adjacent light emitting cells A1 and A2, A2 and A3, . . . , A(n−1) and An. The interconnection layer 145, for example, is connected to the first conductive semiconductor layer 110 of the first light emitting cell A1 and the ohmic contact layer 140 on the second light emitting cell A2 and thereby connects the first light emitting cell A1 and second light emitting cell A2 in series. Through such a process, the interconnection layers 145 may connect the n light emitting cells A1 to An in series.

When the first conductive semiconductor layer 110 is a GaN-based semiconductor, the one end of the interconnection layer 145 may be directly contacted with an N-face which is the bottom of the first conductive semiconductor layer 110.

The second electrode 101 is formed at the ohmic contact layer 110 on the first light emitting cell A1, and the first electrode 102 is formed under the first conductive semiconductor layer 110 of the nth light emitting cell An. The second electrode 101 and the first electrode 103 are implemented as an electrode pad, respectively. The second electrode 101 and the first electrode 103 may be formed before or after being divided by cell unit. The second electrode 101 may not be formed. In this case, a power may be supplied through the conductive support member 170.

A roughness pattern may be formed at the bottom of the first conductive semiconductor layer 110, but it is not limited thereto.

In the semiconductor light emitting device 100, an array group consisting of the light emitting cells A1 to An may be arranged in at least one row or a matrix type under the conductive support member 170.

The semiconductor light emitting device 100 may be formed in one light emitting cell array or a plurality of light emitting cell arrays. In addition, the plurality of light emitting cell arrays may be connected in series, in parallel or in anti-parallel.

Figure 14:
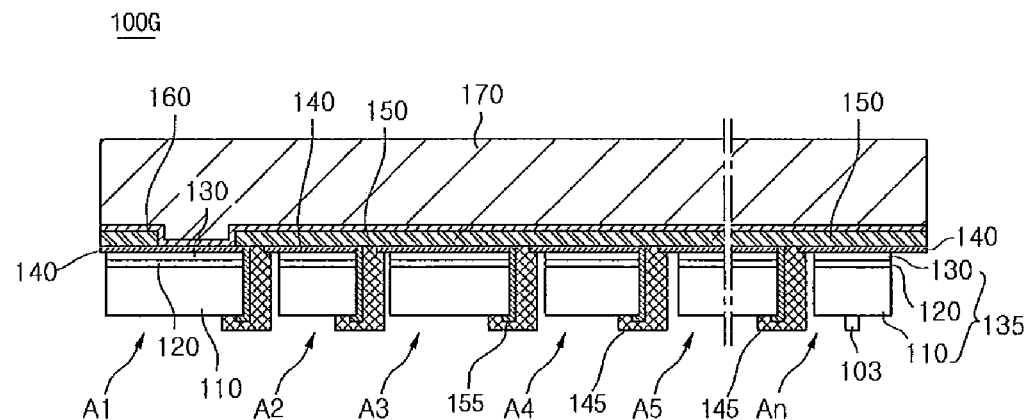
FIG. 14 is a side-sectional view illustrating a semiconductor light emitting device according to a seventh embodiment.

FIG. 14 is a side-sectional view illustrating a semiconductor light emitting device according to a seventh embodiment. In description of the seventh embodiment, repetitive description on the same elements as those of the first embodiment will be omitted and refers to that of the first embodiment.

Referring to FIG. 14, in a semiconductor light emitting device 1000, the second electrode 101 may not be formed. Consequently, the first light emitting cell A1 receives a power through the conductive support member 170, the second electrode layer 160 and the ohmic contact layer 140.

Figure 15:
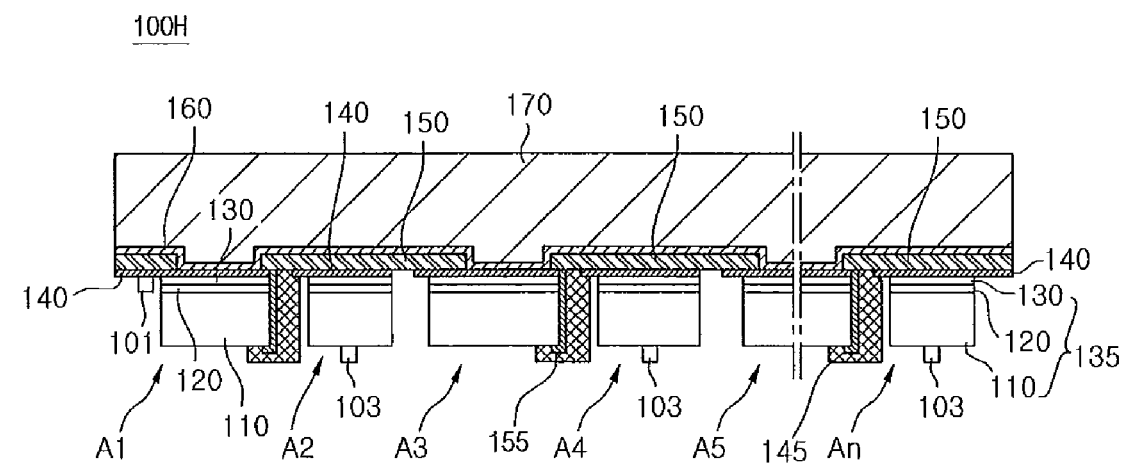
FIG. 15 is a side-sectional view illustrating a semiconductor light emitting device according to an eight embodiment.

FIG. 15 is a side-sectional view illustrating a semiconductor light emitting device according to an eight embodiment. In description of the eight embodiment, repetitive description on the same elements as those of the first embodiment will be omitted and refers to that of the first embodiment.

Referring to FIG. 15, in a semiconductor light emitting device 100H, a plurality of light emitting cell groups (A1, A2), (A3, A4) and (A5, A6) may be connected in parallel under the conductive support member 170. One pair comprises a structure in which two or more light emitting cells are connected in series.

The light emitting cell groups (A1, A2), (A3, A4) and (A5, A6) of each pair are connected in series, and may be disposed in parallel to other pair. The first electrodes 103 may be formed under the first conductive semiconductor layers 110 of the final light emitting cells A2 to An of the each pair, respectively.

The first light emitting cells A1 to An of the each pair are connected to the second electrode layer 160.

The plurality of light emitting cell groups (A1, A2), (A3, A4) and (A5, A6) may be connected in series, in parallel or in anti-parallel, and may be selectively driven by an AC power.

Figure 16:
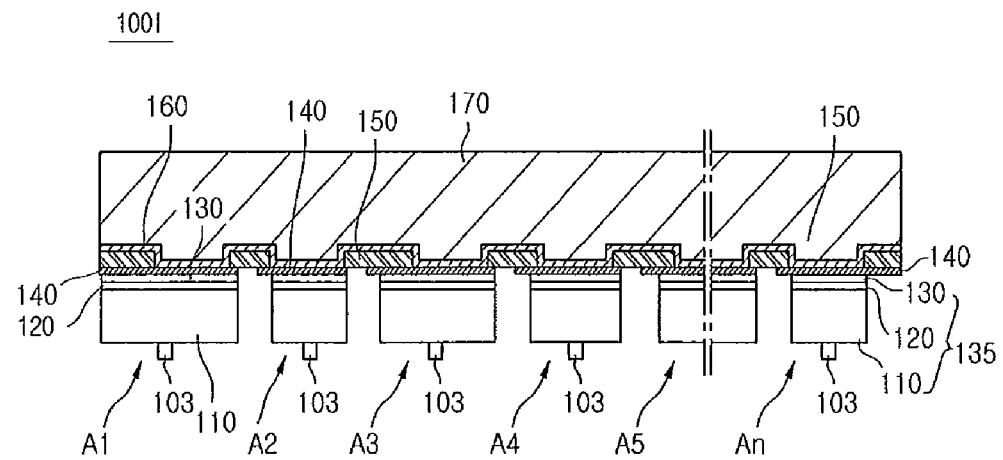
FIG. 16 is a side-sectional view illustrating a semiconductor light emitting device according to a ninth embodiment.

FIG. 16 is a side-sectional view illustrating a semiconductor light emitting device according to a ninth embodiment. In description of the ninth embodiment, repetitive description on the same elements as those of the first embodiment will be omitted and refers to that of the first embodiment.

Referring to FIG. 16, in a semiconductor light emitting device 100I, a plurality of light emitting cells A1 to An may be connected in parallel. The light emitting cells A1 to An are connected to the conductive support member 170 in common, and the first electrode 103 is formed under the first conductive semiconductor layer 110.

Figure 17:
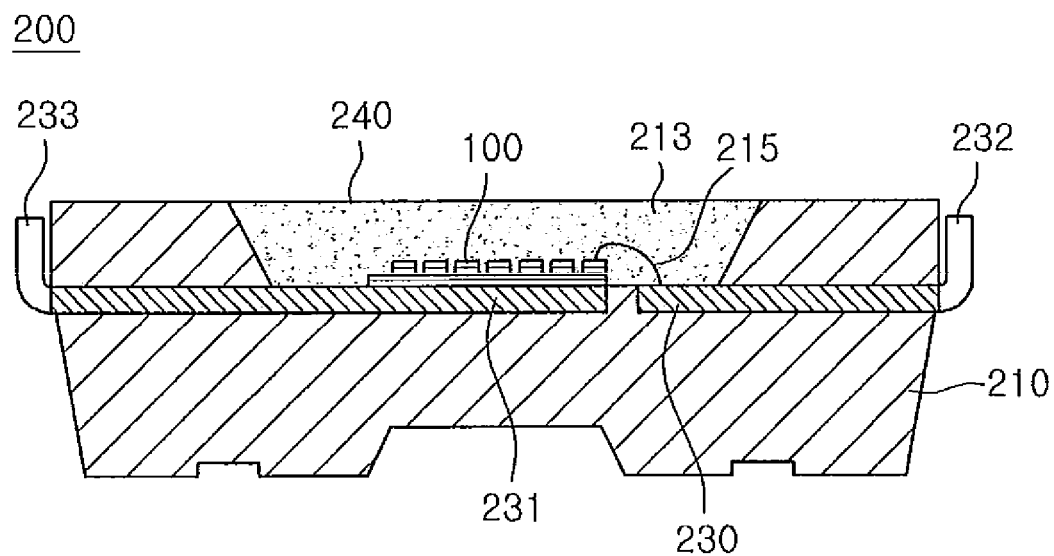
FIG. 17 is a side-sectional view illustrating a light emitting apparatus according to a tenth embodiment.

FIG. 17 is a side-sectional view illustrating a light emitting apparatus according to a tenth embodiment.

Referring to FIG. 17, a light emitting apparatus 200 is a side view type of package. The light emitting apparatus 200 comprises a package body 210 comprising a semiconductor light emitting device 100 and a cavity 213, and a plurality of lead electrodes 230 and 231.

The package body 210 may be formed of any one of a silicon material, a ceramic material and a resin material. For example, the package body 210 may be formed of at least one of silicon, silicon carbide (SiC), aluminum nitride (AlN), polyphthalamide (PPA) and liquid crystal polymer (LCP), but it is not limited thereto. In addition, the package body 110 may be formed in a single-layer substrate structure or a multi-layer substrate structure, or may be injection-molded. However, the package body 110 is not limited to the formation and the structure.

The light emitting apparatus 200 may comprise at least one semiconductor light emitting device 100. If the light emitting apparatus 200 comprises at least one of semiconductor light emitting devices 100, the plurality of semiconductor light emitting devices 100 may be disposed in series, in parallel or in anti-parallel.

The semiconductor light emitting device 100 is disposed at the cavity 213 that is formed at the upper portion of the package body 210. A plurality of lead electrodes 230 and 231 are formed at the cavity 213 in an electrically opened structure. The plurality of lead electrodes 230 and 231 may be formed using a lead frame type, a PCB type and a via hole type.

The semiconductor light emitting device 100 is attached to the second lead electrode 231 with conductive adhesives and is electrically connected to the first lead electrode 230 with a wire 215, thereby receiving a power. Herein, the light emitting apparatus 200 disposes the plurality of semiconductor light emitting devices 100 in series, in parallel or in anti-parallel, and thus may drive the plurality of semiconductor light emitting devices 100 at an AC power. In addition, a plurality of light emitting apparatuses are disposed in series, in parallel or in anti-parallel, and may be driven at the AC power.

A resin 240 such as transparent silicon or epoxy may be formed at the cavity 213. The resin 240 to which a phosphor is added may be formed at the cavity 213. In addition, the side surface of the cavity 213 is formed to be inclined, improving the reflection amount of light.

The package body 210 is mounted on a substrate (not shown) and thereby may be provided as a side view type of light emitting apparatus.

Figure 18:
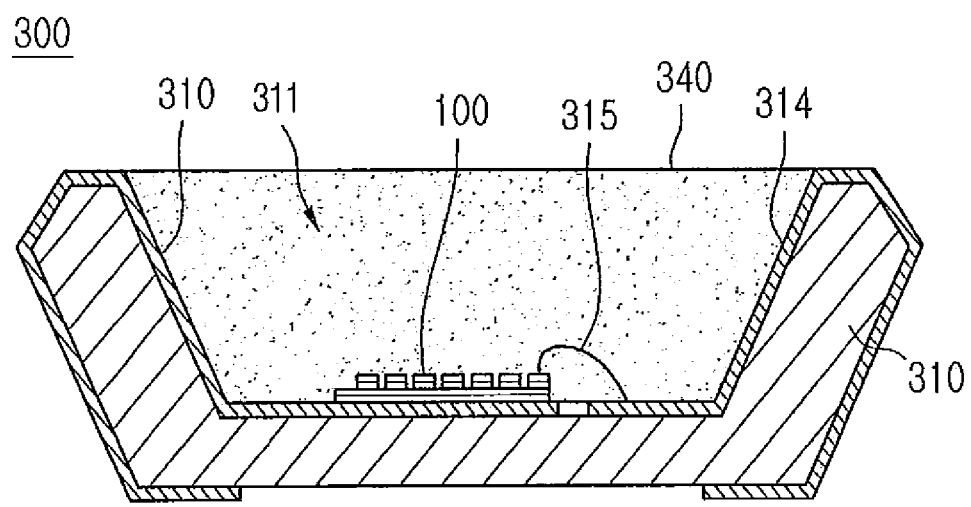
FIG. 18 is a side-sectional view illustrating a light emitting apparatus according to an eleventh embodiment.

FIG. 18 is a side-sectional view illustrating a light emitting apparatus according to an eleventh embodiment.

Referring to FIG. 18, a light emitting apparatus 300 is a top view type of package. The light emitting apparatus 300 comprises a package body 310, a resin 340, a plurality of lead electrodes 310 and 314, and a semiconductor light emitting device 100.

The package body 310 may be a silicon material, or may be implemented with a ceramic substrate or a metal substrate.

A plurality of electrically-opened lead electrodes 310 and 314 are formed at the surface of the package body 310. Another layer, for example, a seed layer or a insulating layer may be formed between the package body 310 and the lead electrodes 310 and 314, but it is not limited thereto.

A cavity 311 is formed at the upper portion of the package body 310. The semiconductor light emitting device 100 is attached to a first lead electrode 310, which is exposed to the cavity 311, with conductive adhesives. The semiconductor light emitting device 100 is connected to a second lead electrode 314 with a wire 315. The lead electrodes 310 and 314 may be formed in a plating type.

The semiconductor light emitting device 100 is mounted in single or in plurality. The plurality of semiconductor light emitting devices 100 may be connected in series, in parallel or in anti-parallel. The semiconductor light emitting device 100 receives a power through the rear surface of the package body 310 to drive, and thus a top view type of light emitting apparatus can be manufactured.

A light-transmitting resin 340 is formed on the cavity 311. The light-transmitting resin 340 may comprise a silicon resin, an epoxy resin or a resin to which a fluorescent substance is added.

The light emitting apparatus according to embodiments may connect a plurality of semiconductor light emitting devices at the inside or outside of a package for driving at an AC power. As a connection node or a connection means, the interconnection pattern of a substrate, a lead frame, a metal layer and a wire may be selectively comprised in the light emitting apparatus.

An embodiment provides a method for manufacturing a semiconductor light emitting device comprising: forming a plurality of compound semiconductor layers on a substrate; forming an ohmic contact layer on the compound semiconductor layers; forming a first insulating layer on the ohmic contact layer; forming a second electrode layer which is formed on the first insulating layer and is electrically connected to a one end of the ohmic contact layer; removing the substrate; etching the compound semiconductor layers and the ohmic contact layer to divide into a plurality of light emitting cells; forming an interconnection layer which connects the light emitting cells in series; and forming a first electrode under an other-end light emitting cell of the light emitting cells.

The semiconductor light emitting device according to embodiments may be provided as a light unit to portable terminals and notebook computers, or may be widely applied to lighting devices and pointing devices.

According to embodiments, a light emitting apparatus or a vertical semiconductor light emitting device, which is driven without a converter that converts an AC signal into a Direct Current (DC) signal, can be provided.

In the above-described embodiments, the technical characteristic of each embodiment may be applied to another embodiment and are not limited to each embodiment. For example, the light emitting cell arrays of the semiconductor light emitting device may be formed in one row or in two rows, and may be connected in series, in parallel or in anti-parallel.

Embodiments provide a semiconductor light emitting device which is driven at an AC power.

According to embodiments, the semiconductor light emitting device for a high-voltage AC power can be driven.

Embodiments provide a light emitting device for AC driving in which the plurality of light emitting cells are connected inside one device in series, in parallel or/and in anti-parallel.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emitting device comprising:
   n (n≧2) light emitting structures including a plurality of compound semiconductor layers and spaced apart from each other;
   a second electrode connected to a first light emitting structure of the n light emitting structures;
   a plurality of ohmic contact layers disposed under each of the light emitting structures;
   a first insulating layer disposed under the plurality of ohmic contact layers;
   a second insulating layer insulating between the light emitting structures;
   an interconnection layer connecting the light emitting structures to each other in series; and
   an electrode layer disposed under the first insulating layer, the electrode layer including a portion electrically and directly connected to the ohmic contact layer disposed under an $n^{th}$ light emitting structure of the n light emitting structures,
   wherein the first insulating layer directly contacts the plurality of ohmic contact layers.

2. The semiconductor light emitting device of claim 1, wherein the electrode layer includes at least one selected from the group consisting of Al, Ag, Pd, Rh, and Pt, or alloy thereof.

3. The semiconductor light emitting device of claim 1, further comprising a conductive support member disposed under the electrode layer.

4. The semiconductor light emitting device of claim 1, wherein each light emitting structure includes a first conductive type semiconductor layer, an active layer under the first conductive type semiconductor layer, and a second conductive type semiconductor layer under the active layer.

5. The semiconductor light emitting device of claim 4, wherein the second insulating layer extends from one sidewall of each light emitting structure to one sidewall of the ohmic contact layer disposed under each light emitting structure, and wherein the interconnection layer is disposed on the second insulating layer and connects the ohmic contact layer disposed under a second light emitting structure to the first conductive type semiconductor layer of a third light emitting structure among the adjacent second and third light emitting structures.

6. The semiconductor light emitting device of claim 1, further comprising a first electrode on the ohmic contact layer disposed under the $n^{th}$ light emitting structure.

7. The semiconductor light emitting device of claim 1, wherein the ohmic contact layer includes at least one selected from the group consisting of ITO, Pt, Ni, Au, Rh, and Pd, or a mixture thereof.

8. The semiconductor light emitting device of claim 1, wherein each of the ohmic contact layers extends beyond an outer side of a sidewall of each of the light emitting structures and connected to at least a portion of the interconnection layer.

9. The semiconductor light emitting device of claim 4, wherein the first conductive type semiconductor layer includes an n type semiconductor layer, and the second conductive type semiconductor layer includes a p type semiconductor layer.

10. The semiconductor light emitting device of claim 3, wherein the conductive support member includes at least one selected from the group consisting of copper, gold, and a carrier wafer.

11. The semiconductor light emitting device of claim 1, wherein one end of an AC power supply is provided through the electrode layer connected to the ohmic contact layer disposed under the $n^{th}$ light emitting structure of the n light emitting structures, and the other end of the AC power supply is connected to the second electrode connected to the first light emitting structure.

12. The semiconductor light emitting device of claim 4, wherein the second electrode is disposed on the first conductive type semiconductor layer.

13. A light emitting apparatus comprising:
   a plurality of semiconductor light emitting devices including a first semiconductor light emitting device and a second semiconductor light emitting device connected to the first semiconductor light emitting device in antiparallel; and
   a connection member connecting the first semiconductor light emitting device to the second semiconductor light emitting device,
   wherein the first and second semiconductor light emitting devices include:
      n (n≧2) light emitting structures including a plurality of compound semiconductor layers and spaced apart from each other;
      a second electrode connected to a first light emitting structure of the n light emitting structures;
      a plurality of ohmic contact layers disposed under each of the light emitting structures;
      a first insulating layer disposed under the plurality of ohmic contact layers;
      a second insulating layer insulating between the light emitting structures;
      an interconnection layer connecting the light emitting structures to each other in series; and
      an electrode layer disposed under the first insulating layer, the electrode layer including a portion electrically and directly connected to the ohmic contact layer disposed under an $n^{th}$ light emitting structure of the n light emitting structures, and
   wherein power is supplied to the second electrode and the electrode layer in the first and second semiconductor light emitting devices,
   wherein the first insulating layer directly contacts the plurality of ohmic contact layers.

14. The light emitting apparatus of claim 13, wherein the second electrode and the electrode layer in the first and second semiconductor light emitting devices are connected to each other in antiparallel by the connection member.

15. The light emitting apparatus of claim 13, wherein the connection member includes one of an interconnection pattern, a lead frame, or an electrode layer.

16. The light emitting apparatus of claim 13, further comprising a package including a package body having a lead frame or an electrode layer on which the first and second semiconductor light emitting devices are mounted.

17. The light emitting device of claim 16, wherein the package body includes a cavity, in which the first and second semiconductor light emitting devices are disposed, and a resin member disposed in the cavity.

18. The light emitting device of claim 13, wherein sum of driving voltages of the light emitting structures of the first and second semiconductor light emitting devices are identical to input AC voltage.

19. The light emitting device of claim 13, further comprising a resistor or a rectifier connected to both terminals of the first and second semiconductor light emitting devices to supply AC power to the both terminals of the first and second semiconductor light emitting devices.

* * * * *